United States Patent
Yang et al.

(10) Patent No.: US 7,088,123 B1
(45) Date of Patent: Aug. 8, 2006

(54) SYSTEM AND METHOD FOR EXTRACTION OF C-V CHARACTERISTICS OF ULTRA-THIN OXIDES

(75) Inventors: Jau-Yuann Yang, Richardson, TX (US); Hamseswari Renganathan, Irving, TX (US); Kaiping Liu, Plano, TX (US); Antonio Luis Pacheco Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/217,144

(22) Filed: Aug. 31, 2005

(51) Int. Cl.
G01R 31/02 (2006.01)

(52) U.S. Cl. ..................... 324/765; 324/158.1
(58) Field of Classification Search ............ None
See application file for complete search history.

(56) References Cited

U.S. PATENT DOCUMENTS 5,266,892 A * 11/1993 Kimura .............. 324/767
5,644,223 A * 7/1997 Verkuil ................ 324/158.1

OTHER PUBLICATIONS

Specification entitled "*Integrating High Frequency Capacitance Measurement for Monitoring Process Variation of Equivalent Oxide Thickness of Ultra-Thin Gate Dielectrics*", by Yuegang Zhao; ™ 2004 Keithley Instruments, Inc. Cleveland, Ohio 44139 (16 pages).

* cited by examiner

Primary Examiner—Jermele Hollington
Assistant Examiner—Jimmy Nguyen
(74) Attorney, Agent, or Firm—Peter K. McLarty; W. James Brady, III; Frederick J. Telecky, Jr.

(57) ABSTRACT

In one embodiment, a method for extracting C-V characteristics of ultra-thin oxides includes coupling a device under test to a testing structure, in which the device under test includes a plurality of transistors. Alternatively, the device under test includes a plurality of varactors. The method further includes inputting a radio frequency signal of at least one GHz into the testing structure, de-embedding the parasitics of the testing structure, inputting a bias into the device under test, determining the capacitance density per gate width of the device under test, plotting capacitance density per gate width versus gate length to obtain a first curve, and determining a slope of the first curve. These steps are repeated for one or more additional biasing conditions, and the determined slopes are plotted on a capacitance density per voltage graph to obtain a C-V curve for the device under test.

20 Claims, 4 Drawing Sheets

SYSTEM AND METHOD FOR EXTRACTION OF C-V CHARACTERISTICS OF ULTRA-THIN OXIDES

TECHNICAL FIELD OF THE INVENTION

This invention relates in general to the manufacturing of electronic components and, more particularly, to a system and method for extraction of C-V characteristics of ultra-thin oxides.

BACKGROUND OF THE INVENTION

As CMOS devices keep scaling down, the gate oxide thickness becomes thinner. This presents a great challenge to traditional capacitance measurement used to monitor dielectric thickness for process variation. For example, an increase of the gate leakage current occurs at a rate of about one decade per 1.5 angstroms. When the equivalent oxide thickness ("EOT") is below fifteen angstroms, the traditional method of extracting the capacitance vs. voltage ("C-V") characteristic of the oxide by low frequency measurements on a block MOS capacitor is rendered invalid because of the gate leakage.

SUMMARY OF THE INVENTION

In one embodiment, a method for extracting C-V characteristics of ultra-thin oxides includes coupling a device under test to a testing structure, in which the device under test includes a plurality of transistors. Alternatively, the device under test includes a plurality of varactors. The method further includes inputting a radio frequency signal of at least one GHz into the testing structure, de-embedding the parasitics of the testing structure, inputting a bias into the device under test, determining the capacitance density per gate width of the device under test, plotting capacitance density per gate width versus gate length to obtain a first curve, and determining a slope of the first curve. These steps are repeated for one or more additional biasing conditions, and the determined slopes are plotted on a capacitance density per voltage graph to obtain a C-V curve for the device under test.

Depending on the specific features implemented, particular embodiments of the present invention may exhibit some, none or all of the following technical advantages. Various embodiments may be capable of extracting the C-V characteristic of gate oxides with EOT less than about 15 angstroms with accuracy and reliability, which may be important for the development and production control of the gate oxide of advanced CMOS devices. The deleterious effects of the leakage current through the oxide may be eliminated by using GHz frequencies.

Other technical advantages are readily apparent to one skilled in the art from the following figures, descriptions, and claims.

BRIEF DESCRIPTION OF THE DRAWINGS

For a more complete understanding of the invention and the advantages thereof, reference is now made to the following description, taken in conjunction with the accompanying drawings, wherein like reference numerals represent like parts, in which.

DETAILED DESCRIPTION OF EXAMPLE EMBODIMENTS OF THE INVENTION

Figure 1:
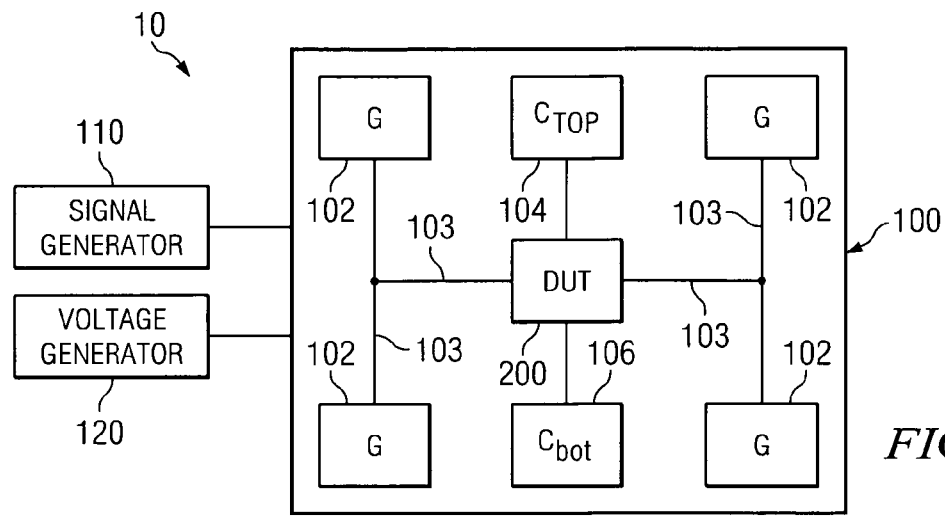
FIG. 1 is a block diagram of a system for extraction of C-V characteristics of ultra-thin oxides according to one embodiment of the invention.

FIG. 1 is a block diagram of a system 10 for extraction of capacitance-voltage ("C-V") characteristics of thin oxides according to one embodiment of the invention. In the illustrated embodiment, system 10 includes a device under test ("DUT") 200 coupled to a testing structure 100, a signal generator 110, and a voltage generator 120. In a preferred embodiment, signal generator 110 and voltage generator 120 may be combined in a vector network analyzer ("VNA"). Although not illustrated a suitable computer or computing device is typically associated with system 100 and is operable to handle a number of steps of the methods outlined below.

DUT 200 may be any suitable semiconductor device having any suitable types of transistors. For example, in a particular embodiment of the invention, the transistors associated with DUT 200 are CMOS transistors that include thin gate oxides, such as those having a thickness of no more than about fifteen angstroms. DUT 200 is discussed in further detail below in conjunction with FIGS. 2 through 3B.

Testing structure 100 may be any suitable 2-port network, such as a G-S-G testing structure, that is operable to de-embed the parasitics associated with testing structure 100, such as those due to contact resistance (between the probe needle and contact pads 102) and lead inductance of a plurality of leads 103. Typical de-embedding structures are open, short, and thru. Generally, a suitable vector network analyzer may be utilized to measure the RF scattering parameters, which are then used to calculate the Y parameters, the Z parameters, and the RF capacitance of DUT 200, as is well known in the art. Other suitable testing structures for de-embedding parasitics are contemplated by the present invention.

Signal generator 110 may be any suitable device operable to generate electrical signals, such as radio frequency ("RF") signals. Signal generator 110 may be coupled to testing structure 100 in any suitable manner. For example, signal generator 110 may be coupled to contact pad 104 in order to connect to the gate of DUT 200 and may be coupled to contact pad 106 in order to couple to the source and drain of DUT 200.

Voltage generator 120 may be any suitable voltage generator, such as a bias voltage generator operable to input a bias voltage into DUT 200. Voltage generator 120 may be coupled to testing structure 100 in any suitable manner. In one embodiment of the invention, the bias voltage input into DUT 200 by voltage generator 120 is between −2.0 volts and +2.0 volts. However, other suitable biases are contemplated by the present invention.

Figure 3A:
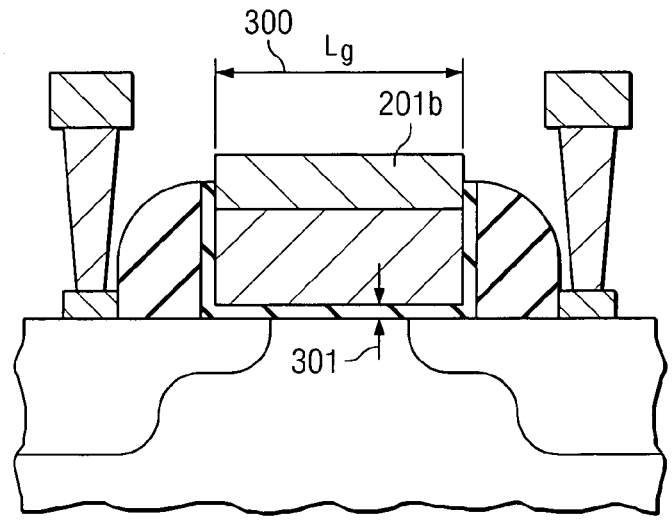
FIGS. 3A and 3B are cross-sectional views of different DUT's according to one embodiment of the invention.
Figure 3B:
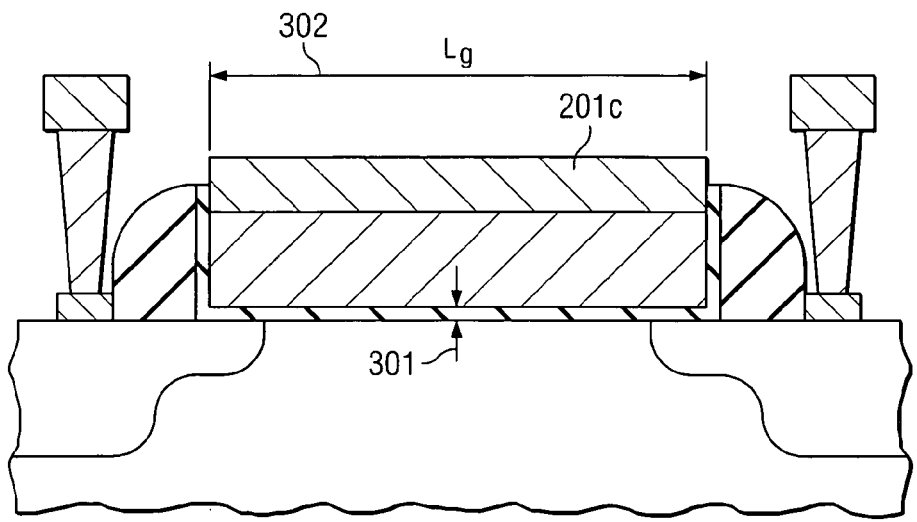
Figure 2:
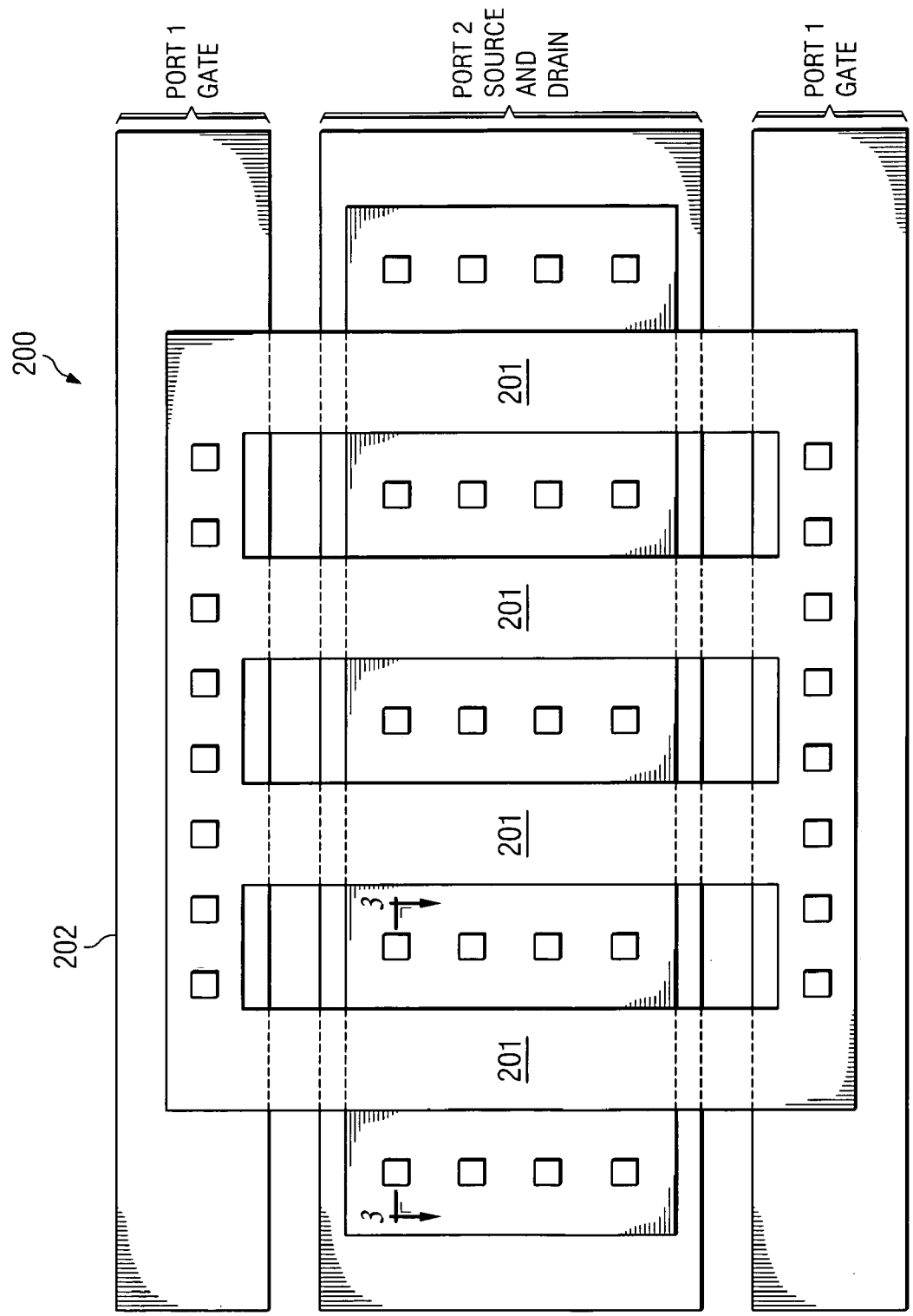
FIG. 2 is a partial plan view of a DUT according to one embodiment of the invention.

FIG. 2 is a partial plan view of DUT 200 and FIGS. 3A and 3B are cross-sectional views of two different embodiments of DUT 200 to be measured. Illustrated in FIG. 2 is a multi-finger transistor 202 associated with DUT 200. In the illustrated embodiment, multi-finger transistor 202 includes a plurality of gates 201 having the same gate length. As shown in FIG. 3A, an embodiment of DUT 200 includes a gate 201b having a gate length 300. As shown in FIG. 3B, an embodiment of DUT 200 includes a gate 201c having a gate length 302. Although gate length 300 is less than gate length 302 in these embodiments, both gate length 300 and gate length 302 may be any suitable length. As an example only, the gate lengths 300, 302 may be between 0.05 microns and 1.0 microns. Each of the gates 201 associated with the transistors of DUT 200 may be any suitable length and are the same as other gates 201 of the same DUT. Generally, when the gate length is shorter, the capacitance is much less than that of a greater gate length.

As illustrated in FIGS. 3A and 3B, a gate oxide thickness 301 is illustrated for multi-finger transistor 202 of DUT 200. Although the present invention is suitable with any gate oxide thickness, the present invention is particularly suitable for gate oxide thicknesses of no more than about fifteen angstroms, which are beginning to become prevalent in many CMOS devices. These thin gate oxides make traditional methods of extracting the C-V characteristic of the oxide by low frequency measurements on a block MOS capacitor invalid because of gate leakage. Thus, DUT 200 is utilized in a method of the present invention that is capable of extracting the C-V characteristic of gate oxides with equivalent oxide thickness ("EOT") less than about fifteen angstroms with accuracy and reliability.

Figure 4:
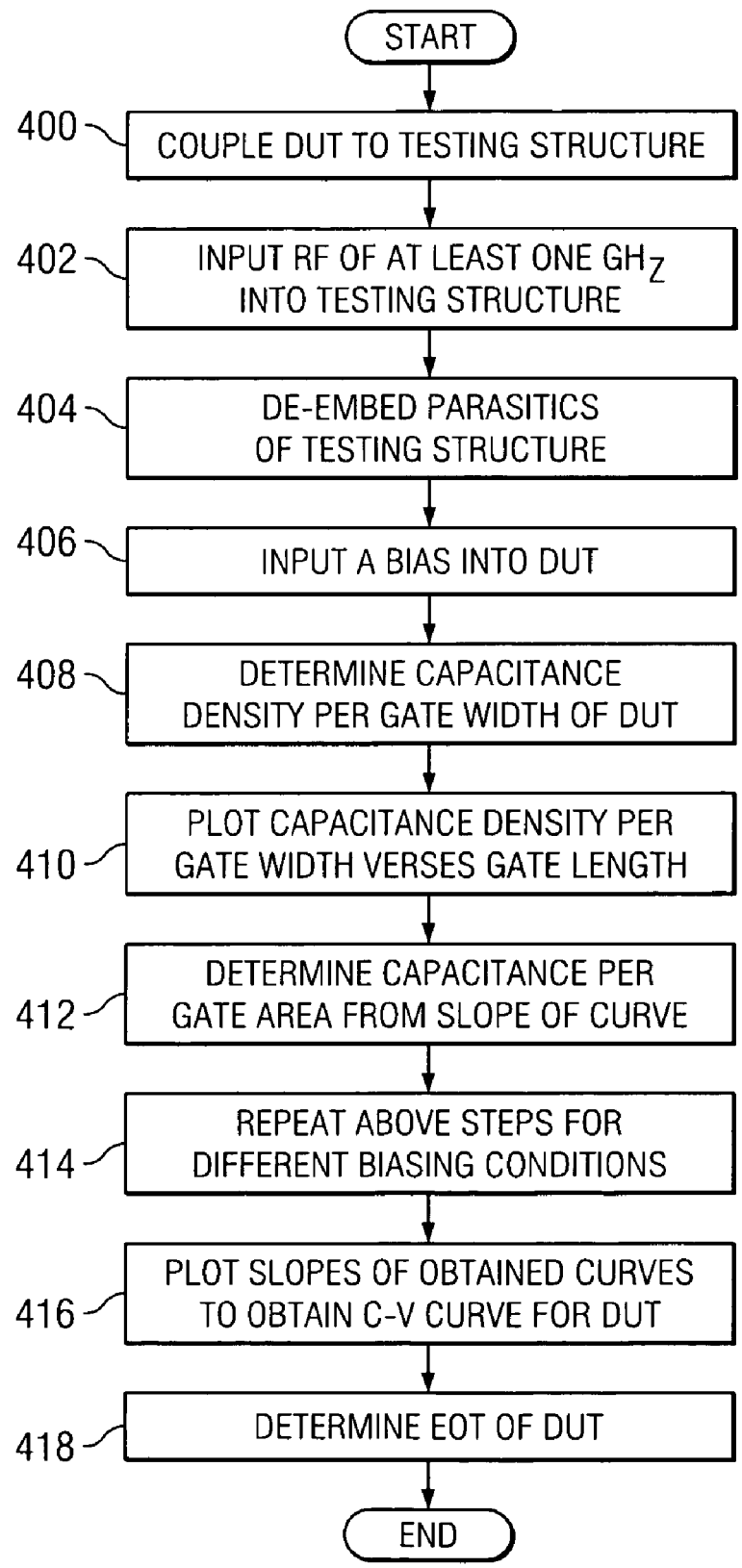
FIG. 4 is a flowchart of a method for extraction of C-V characteristics of ultra-thin oxides according to one embodiment of the invention.

FIG. 4 is a flowchart of an example method for extracting the C-V characteristics of thin oxides according to one embodiment of the invention. The example method begins at step 400 where DUT 200 is coupled to testing structure 100. A radio frequency signal of at least 1.0 GHz is input into testing structure 100 by signal generator 110 at step 402. In a more particular embodiment of the invention, the RF signal is between 1.0 and 2.4 GHz. Generally, the higher the test frequency used, the better the capacitance measurement is on thin gate oxides.

At step 404, the parasitics associated with testing structure 100 are de-embedded. As described above, any suitable de-embedding methods and structures are contemplated by the present invention. The de-embedding of the parasitics associated with testing structure 100 allows the capacitance, resistance, and inductance of DUT 200 to be obtained. A bias may then be input into DUT 200 by voltage generator 120 at step 406. As a result of the input bias, the capacitance density per gate width of DUT 200 may be determined, as indicated by step 408.

Figure 5:
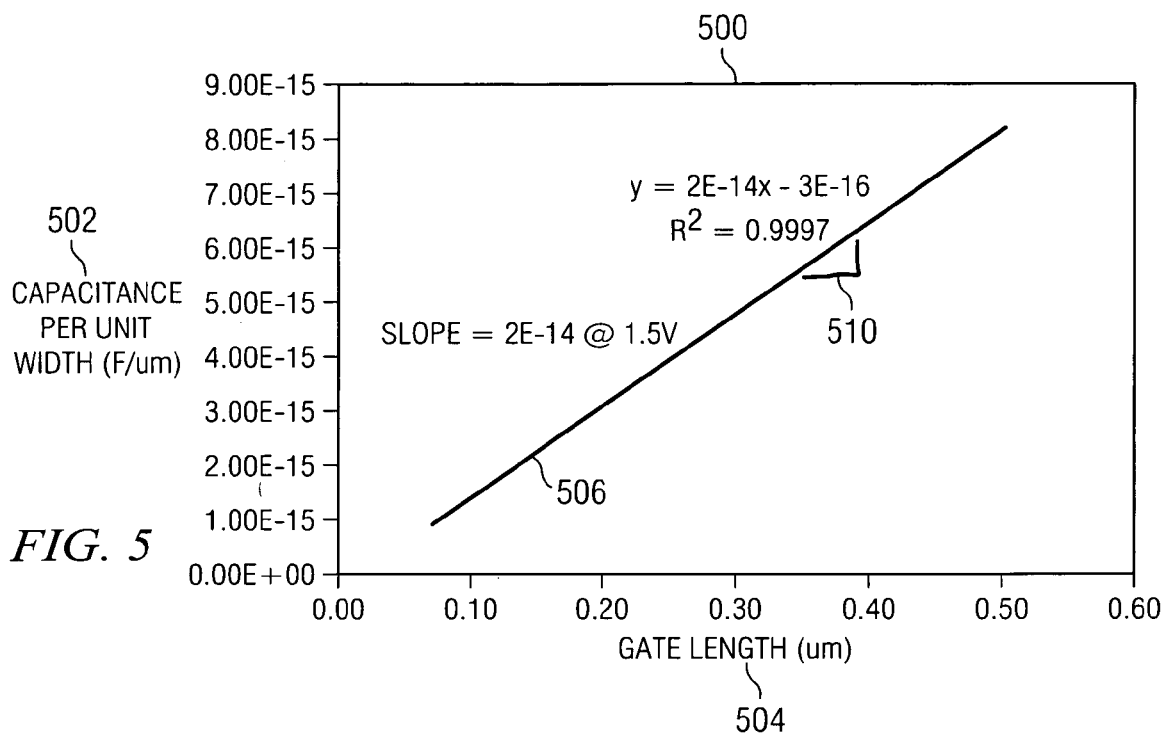
FIG. 5 is a graph of capacitance per unit gate width versus gate length according to one embodiment of the invention.

At step 410, and with reference to FIG. 5, the capacitance density per gate width, as indicated by reference numeral 502, that is determined at step 408 is plotted against the gate length, as indicated by reference numeral 504, on a graph 500. How many graphical points there are to utilize in graph 500 depends on how many DUTs of different gate lengths are used. For example, as illustrated in FIG. 5, three independent DUTs of different gate lengths were utilized and one of them had a gate length of approximately 0.07 microns, another had a gate length 0.20 microns, and a third had a length of 0.50 microns. These graphical points are connected to form a curve 506 that has a slope 510 that is indicative of the capacitance per gate area of the gate dielectric 301 at the bias being used. Thus, at step 412, the capacitance per gate area is determined from the slope of curve 506 for a given bias that is being used. In the specific example illustrated in FIG. 5, the slop of curve 506 is 2E-14 at a gate bias of 1.5V.

Figure 6:
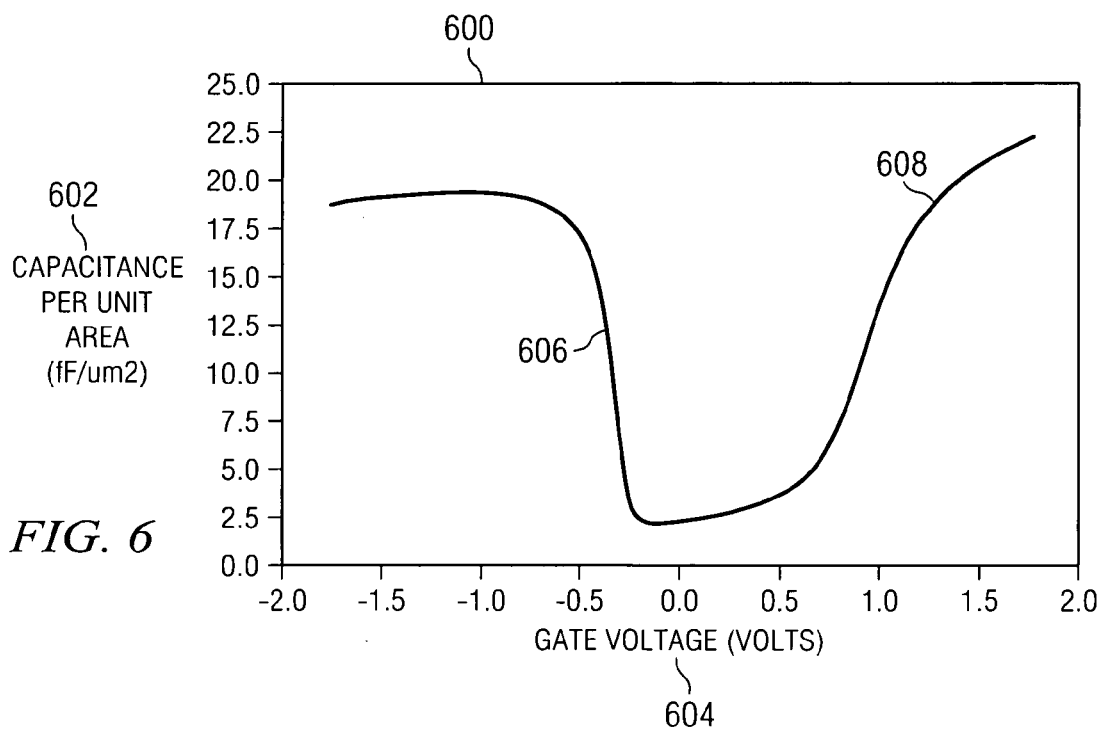
FIG. 6 is a graph of capacitance per unit area versus gate voltage (i.e., a C-V curve) according to one embodiment of the invention.

The above steps of the example method are repeated, as indicated by step 414, for different biasing conditions. Again, voltage generator 120 is operable to input these different biasing conditions into DUT 200. The result of each of these biasing conditions is the capacitance per gate area from the slopes of each of the curves obtained at step 410, and each of these slopes are plotted, at step 416, on a graph 600 to obtain a C-V curve 606 for DUT 200. For example, referring to FIG. 6, the capacitance per unit area 602 is plotted against gate voltage 604 on graph 600. C-V curve 606 is thus obtained. Using the specific example outlined in FIG. 5, the slope of 2E-14 at 1.5V would be the slope of curve 606 at a bias of 1.5V, as indicated by reference numeral 608. The C-V curve 606 thus obtained is a reliable and accurate measurement of the C-V characteristic of the gate oxide 301 of DUT 200.

As indicated at step 418 of the flowchart of FIG. 4, the equivalent oxide thickness ("EOT") of DUT 200 may be based on C-V curve 606. Any suitable method may be utilized to obtain the EOT, such as a NCSU-Quantum-CV program. This then ends the example method outlined in FIG. 4.

Thus, a system and method within the teachings of the present invention is capable of extracting the C-V characteristic of gate oxides with EOT less than about fifteen angstroms with accuracy and reliability, which may be important for the development and production control of the gate oxide of advanced transistor devices, such as CMOS devices. The deleterious effects of the leakage current through the gate oxide may be eliminated by using a radio frequency of at least 1.0 GHz in some embodiments.

Although embodiments of the invention and their advantages are described in detail, a person skilled in the art could make various alterations, additions, and omissions without departing from the spirit and scope of the present invention, as defined by the appended claims.

What is claimed is:

1. A method for extracting C-V characteristics of ultra-thin oxides, comprising:
    coupling a device under test to a testing structure, the device under test including a plurality of transistors;
    inputting a radio frequency signal of at least one GHz into the testing structure;
    de-embedding parasitics of the testing structure;
    inputting a bias into the device under test;
    determining a capacitance density per gate width of the device under test;
    plotting capacitance density per gate width versus gate length to obtain a first curve;
    determining a slope of the first curve;
    repeating the above steps for one or more additional biases; and
    plotting the determined slopes on a capacitance density per voltage graph to obtain a C-V curve for the device under test.

2. The method of claim 1, further comprising determining the an equivalent oxide thickness of the device under test based on the C-V curve.

3. The method of claim 1, wherein the device under test comprises a gate oxide thickness of no more than fifteen angstroms.

4. The method of claim 1, wherein inputting the bias into the device under test comprises inputting a bias between −2.0 volts and +2.0 volts.

5. The method of claim 1, wherein de-embedding the parasitics of the testing structure comprises removing the parasitics of one or more pads and one or more leads of the testing structure.

6. The method of claim 1, further comprising coupling a second device under test to the testing structure that includes transistors having different gate lengths than the original device under test.

7. The method of claim 1, causing the radio frequency signal to be between one GHz and 2.4 Ghz.

8. A system for extracting C-V characteristics of ultra-thin oxides, comprising:
  a device under test coupled to a testing structure, the device under test including a plurality of transistors;
  a signal generator operable to input a radio frequency signal of at least one GHz into the testing structure;
  a voltage generator operable to input a plurality of biases into the device under test; and
  a computing device operable to:
    de-embed parasitics of the testing structure for respective biases;
    determine a capacitance density per gate width of the device under test for respective biases;
    plot capacitance density per gate width versus gate length to obtain a first curve for respective biases;
    determine a slope of the first curve for respective biases; and
    plot the determined slopes on a capacitance density per voltage graph to obtain a C-V curve for the device under test.

9. The system of claim 8, wherein the computing device is further operable to determine an equivalent oxide thickness of the device under test based on the C-V curve.

10. The system of claim 8, wherein the device under test comprises a gate oxide thickness of no more than fifteen angstroms.

11. The system of claim 8, wherein the biases are between −2.0 volts and +2.0 volts.

12. The system of claim 8, the computing device is further operable to remove the parasitics of one or more pads and one or more leads of the testing structure.

13. The system of claim 8, further comprising a second device under test coupled to the testing structure that includes transistors having different gate lengths than the original device under test.

14. A system for extracting C-V characteristics of ultra-thin oxides, comprising:
  means for coupling a device under test to a testing structure, the device under test including a plurality of transistors;
  means for inputting a radio frequency signal of at least one GHz into the testing structure;
  means for de-embedding the parasitics of the testing structure;
  means for inputting a bias into the device under test;
  means for determining a capacitance density per gate width of the device under test;
  means for plotting capacitance density per gate width versus gate length to obtain a first curve;
  means for determining a slope of the first curve;
  means for repeating the above steps for one or more additional biases; and
  means for plotting the determined slopes on a capacitance density per voltage graph to obtain a C-V curve for the device under test.

15. The system of claim 14, further comprising means for determining an equivalent oxide thickness of the device under test based on the C-V curve.

16. The system of claim 14, wherein the device under test comprises a gate oxide thickness of no more than fifteen angstroms.

17. The system of claim 14, wherein the bias is between −2.0 volts and +2.0 volts.

18. The system of claim 14, further comprising means for removing the parasitics of one or more pads and one or more leads of the testing structure.

19. The system of claim 14, further comprising means for coupling a second device under test coupled to the testing structure that includes transistors having different gate lengths than the original device under test.

20. The system of claim 14, wherein the radio frequency signal is between one GHz and 2.4 Ghz.

* * * * *